(12) United States Patent
Kurtz et al.

(10) Patent No.: US 6,225,647 B1
(45) Date of Patent: May 1, 2001

(54) PASSIVATION OF POROUS SEMICONDUCTORS FOR IMPROVED OPTOELECTRONIC DEVICE PERFORMANCE AND LIGHT-EMITTING DIODE BASED ON SAME

(75) Inventors: Anthony D. Kurtz, Teaneck; Jonathan E. Spanier, Cliffside Park, both of NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 09/123,181

(22) Filed: Jul. 27, 1998

(51) Int. Cl.[7] ................................................. H01L 33/60
(52) U.S. Cl. ........................ 257/94; 257/103; 257/3; 257/22
(58) Field of Search ........................ 438/694, 22; 257/3, 257/485, 79, 80, 94, 77, 103, 22

(56) References Cited

U.S. PATENT DOCUMENTS

| | | | |
|---|---|---|---|
| 5,298,767 | 3/1994 | Shor et al. | 257/77 |
| 5,331,180 | 7/1994 | Yamada et al. | 257/3 |
| 5,376,241 | 12/1994 | Shor et al. | 204/129 |
| 5,427,977 | * 6/1995 | Yamada et al. | 437/127 |
| 5,454,915 | 10/1995 | Shor et al. | 204/129.3 |
| 5,569,932 | * 10/1996 | Shor et al. | 257/3 |
| 5,644,156 | 7/1997 | Suzuki et al. | 257/485 |
| 5,685,946 | 11/1997 | Fathauer et al. | 156/630 |
| 5,834,378 | * 11/1998 | Kurtz et al. | 438/694 |

* cited by examiner

Primary Examiner—Vu A. Le
Assistant Examiner—Brad Smith
(74) Attorney, Agent, or Firm—Arthur L. Plevy; Duane, Morris & Heckscher

(57) ABSTRACT

A method for substantially improving the photoluminescent performance of a porous semiconductor, involving the steps of providing a bulk semiconductor substrate wafer of a given conductivity, wherein the substrate wafer has a porous semiconductor layer of the same conductivity as the bulk semiconductor substrate wafer, and the porous semiconductor layer is made up of a plurality of pores interspersed within a plurality of nanocrystallites, wherein each of the pores is defined by a pore wall and each of the nanocrystallites has a given thickness. Next, in the method, at least one monolayer layer of passivating material is generated on the pore wall of each of the pores, to passivate the porous semiconductor layer. The one layer of passivating material substantially eliminates dangling bonds and surface states which are associated with the porous semiconductor layer. The resulting passivated porous semiconductor layer exhibits a quantum efficiency of approximately 5 percent. In one embodiment of the present invention, the one monolayer of passivating material is an oxide which is generated by placing the bulk semiconductor substrate wafer into a furnace set a predetermined temperature and a predetermined pressure; introducing dry oxygen into the furnace for predetermined time period to grow the one monolayer of oxide on the pore wall of each of the pores; and cooling the substrate wafer at an ambient temperature and an ambient pressure. The predetermined time period is approximately 5 minutes. Also described is a heterojunction light emitting diode device which employs a passivated porous semiconductor layer made as described above and a method for fabricating same.

9 Claims, 3 Drawing Sheets

PASSIVATION OF POROUS SEMICONDUCTORS FOR IMPROVED OPTOELECTRONIC DEVICE PERFORMANCE AND LIGHT-EMITTING DIODE BASED ON SAME

FIELD OF THE INVENTION

This invention relates generally to semiconductor devices and more particularly, to a method for introducing an extremely thin passivating film onto an anodized or photoanodized-created, non-planar porous surface of a semiconductor in order to enhance the luminescence thereof.

BACKGROUND OF THE INVENTION

It is well known in the art that anodized or photoanodized-created porous semiconductors exhibit unique optical properties which can not be matched by their bulk semiconductor counterparts. For example, porous silicon (Si) exhibits high efficiency luminescence above the 1.1 eV band-gap of bulk silicon, which enables optical devices to be fabricated from porous Si. In another example, porous alpha-silicon carbide (6H—SiC) has superior optical and unique electronic properties due to its geometry and resulting band structure, including visible transparency, intense blue photoluminescence and electroluminescence as compared with bulk SiC, which is inferior by way of the indirect nature of bulk SiC's band-gap that limits the efficiency of bulk SiC-based optoelectronic devices. In the case of SiC, by electrochemically fabricating a microcrystalline porous structure with pore spacings of "quantum" dimensions (less than 10 nm) which provides a large internal surface area using either dark-current or light-assisted electrochemical means as disclosed in U.S. Pat. No. 5,376,241 entitled FABRICATING POROUS SILICON CARBIDE and U.S. Pat. No. 5,454,915 entitled METHOD OF FABRICATING POROUS SILICON CARBIDE (SIC), both of which were issued to Joseph S. Shor and Anthony D. Kurtz on Oct. 3, 1995 and assigned to Kulite Semiconductor Products, Inc. the assignee herein, it is possible to increase both the band-gap and quantum efficiency, resulting in UV or deep blue luminescence. Such porous SiC films exhibit a spectrally integrated photoluminescence intensity (and efficiency) which is approximately twenty (20) times higher than that which is observed from bulk SiC, thus, devices fabricated from porous SiC using existing processing techniques such as those described in U.S. Pat. Nos. 5,376,241 and 5,454,915, enable the development of semiconductor UV and blue light source and UV/blue optoelectronic devices.

The luminescence in the blue range of the spectrum (approximately 2.8 eV) can be further enhanced by passivating porous SiC with a passivation agent such as oxygen or hydrogen. Passivation enables the microcrystalline structures to satisfy the conditions for quantum confinement by preventing surface recombination at the dangling bond. Passivating agents that may be employed for this purpose include atomic hydrogen, deposited by a plasma or by an HF dip, oxygen, formed by thermal oxidation, anodically, or PECVD (plasma enhanced chemical vapor deposition) of oxygen, or any other passivating agent which will pin the dangling bond sites. The passivation exhibited by porous SiC enhanced luminescence can be utilized in the fabrication of blue semiconductor light sources such as light emitting diodes (LED's).

Initial demonstrations of room temperature visible luminescence from porous semiconductor material such as porous SiC or porous Si, created much conjecture about the mechanisms which provide visible luminescence. However, it is now generally agreed, based on considerable theoretical and experimental evidence, that at least a portion of the enhancement of the luminescence is associated with quantum structures in the porous semiconductor material. These quantum structures allow a relaxation of the momentum selection rules by confining the charge carriers spatially, thus allowing direct band-gap transitions. Additionally, it has been demonstrated in porous silicon that the quantum confinement of charge carriers increases the effective band-gap, thereby pushing it into the visible region.

It is also generally agreed that the surface chemistry in porous semiconductor materials plays an important role in luminescence. This suggests that luminescence in passivated porous semiconductor materials may have similar mechanisms as in bulk semiconductor materials like Si, which exhibit band-gap widening into the visible region when hydride species are formed on the surface. A portion of the visible luminescence of porous Si, for example, may be associated with silicon hydride (SiH). It is not positively known whether the hydrogen termination serves only to passivate the surface or whether there is a contribution to the luminescence by amorphous SiH. Nevertheless, it is very clear that silicon microcrystals having dimensions of less than 5 nm, exhibit band-gap widening and the above-described band-gap luminescence.

In terms of developing optoelectronic devices from porous semiconductor materials, some progress has been made in developing porous Si and porous Si—Ge light emitting devices. Since the oxidation rates of bulk SiC and porous SiC are much lower than that of bulk Si and porous Si, and since SiC has been identified as a material for use at high temperatures, optoelectronic devices based on porous SiC, will be much more stable over longer periods of time, and also at higher temperatures than those based on porous Si.

Accordingly, there is a need for an improved method for passivating the large internal surface area of porous semiconductors, especially porous SiC.

SUMMARY OF THE INVENTION

A method for substantially improving the photoluminescent performance of a porous semiconductor. The method comprises the steps of providing a bulk semiconductor substrate wafer of a given conductivity, wherein the substrate wafer has a porous semiconductor layer of the same conductivity as the bulk semiconductor substrate wafer, and the porous semiconductor layer is comprised of a plurality of pores interspersed within a plurality of nanocrystallites, wherein each of the pores is defined by a pore wall and each of the nanocrystallites has a given diameter. Next, in the method, at least one monolayer layer of passivating material is generated on the pore wall of each of the pores, to passivate the porous semiconductor layer. The one layer of passivating material substantially eliminates dangling bonds and surface states which are associated with the porous semiconductor layer. The resulting passivated porous semiconductor layer exhibits a quantum efficiency of approximately 5%.

In one embodiment of the present invention, the one monolayer of passivating material comprises an oxide and the step of generating one monolayer of passivating material includes the steps of: placing the bulk semiconductor substrate wafer into a furnace set at a predetermined temperature and a predetermined pressure; introducing dry oxygen into the furnace for predetermined time period to grow the one monolayer of oxide on the pore wall of each of the pores; and cooling the substrate wafer at an ambient temperature and an ambient pressure. The predetermined time period is approximately 5 minutes.

Also described is a heterojunction light emitting diode device which employs a passivated porous semiconductor layer made as described above and a method for fabricating same.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The present invention provides a novel method for passivating the large internal surface area of a porous region formed in a bulk semiconductor substrate, the porous region being fabricated by electrochemical anodization or photoanodization techniques described in the earlier mentioned U.S. Pat. Nos. 5,376,241 and 5,454,915, the entire disclosures of which are both incorporated herein by reference. The porous semiconductor region to be passivated, is made up of very fragile "quantum-confined" columnar nanocrystallite structures. The passivation method of the present invention preferably involves a very short, dry thermal oxidation (anodic processing or PECVD of oxygen are also contemplated in the present invention) of the semiconductor nanocrystallite structures in the porous semiconductor layer which leaves these "quantum-confined" columnar structures with both smaller diameters, and an extremely thin passivating film, on the order of 1 nm in thickness. The passivating film introduced to the nonplanar surface of the porous semiconductor layer enhances its radiative or luminescence efficiency. In fact, the resulting passivated porous SiC layer possesses an observed photolumimescence intensity which is many times more intense as compared to as-anodized porous SiC, as will be explained later on in greater detail.

Figure 1A:
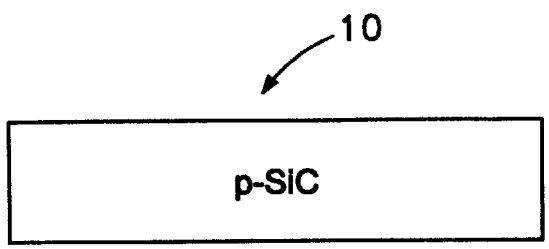
FIG. 1A is a side cross-sectional view through a bulk silicon carbide substrate wafer.

With reference to FIG. 1A, there is shown a semiconductor substrate wafer 10 fabricated from a bulk semiconductor material, preferably, SiC. The SiC substrate wafer 10 is preferably monocrystalline in structure and doped to obtain a given conductivity (either n or p). By way of example in FIG. 1A, the substrate wafer 10 is doped with an p-type impurity.

Figure 1B:
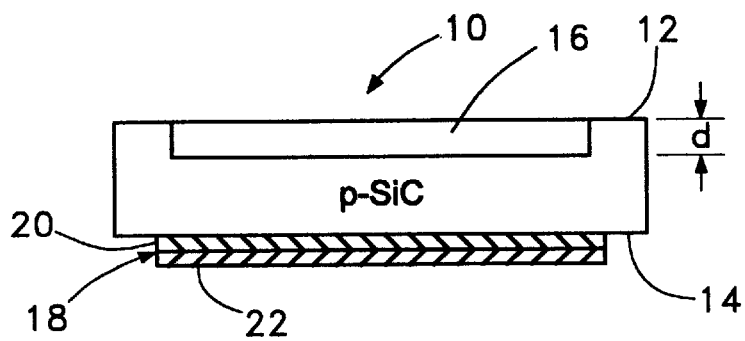
FIG. 1B is a side cross-sectional view through the bulk silicon carbide substrate wafer after anodization or photoanodization.
Figure 1C:
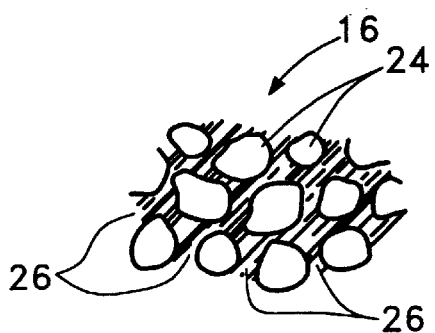
FIG. 1C is an enlarged cross-sectional side view of the porous silicon carbide layer.

In accordance with the teachings of U.S. Pat. Nos. 5,376, 241 and 5,454,915, the n-type SiC substrate 10 is treated so that a porous SiC film layer 16 is formed therein, as shown in FIGS. 1B and 1C. This is accomplished by electrochemically anodizing or photoanodizing the substrate wafer 10 so that the p-type SiC becomes porous to a predetermined depth d. There are a variety of fabrication conditions which result in pore formation, and the microstructure, pore size, pore spacing, and morphology of the semiconductor material are dependent upon the process parameters. Prior to anodization or photoanodization, the carbon face 12 is polished and then masked for porous layer patterning, while the back, unpolished side 14 of the substrate wafer 10 is electrically contacted with an Ohmic contact 18. The Ohmic contact 18 can consist of deposited and annealed layers 20 and 22 of titianium and platinum respectively, or alternatively consist of a layer of aluminum to provide a low resistance electrical contact. It should be understood, that other metal combinations may also be used to form Ohmic contacts on p-type SiC. For example, deposited and annealed $Ta_5Si_3$ and Pt (tantalum silicide and platinum) or deposited and annealed TiW (titanium tungsten) can be used to form Ohmic contacts.

The substrate wafer 10 is placed in an electrochemical cell containing an electrolyte such as, for example, dilute hydrofluoric acid solution, where the substrate wafer 10 acts as the working electrode and is biased with respect to a saturated calomel reference electrode of the cell, at a suitable potential for the p-type layer to electrochemically corrode.

In one embodiment, the masked surface of substrate 10 is exposed to the electrolyte with a dark anodic current. The depth d of the porous p-type layer 16 and its nano- or micro-structure are determined by the anodization time, the applied anodic potential and the resulting current density, the electrolyte concentration, the doping level of the substrate, and the extent to which the process (or reaction) is reaction-rate-controlled, or mass- or charge-transfer-limited. In another embodiment, ultraviolet (UV) light illuminates the masked surface of the substrate 10. In this case, the depth d of the porous p-type layer 16 and its structure is determined by the anodization time, the UV light intensity, the face on which the sample is illuminated, the applied anodic potential and the resulting current density, the electrolyte concentration, the doping levels of the substrate, and the extent to which the process (or reaction) is reaction-rate controlled, or diffusion-limited. The wavelength of light $\lambda$ which is used to photoanodize the region 16 of the substrate wafer 10 that will become porous SiC is selected so that the absorption depth $1/\alpha$ of the light in SiC is roughly equal to the thickness $d_1$ of the porous layer 16, as shown in FIG. 1B.

The resulting pores formed in layer 16 can be best seen in the enlarged view of FIG. 1C. As shown, the pores 24 are generally of submicron dimensions, with the pore sizes averaging approximately 10 nm (pores can range between 5 and 100 nm) and the interpore spacing being on the order of 3–150 nm. As such, the porous layer 16 exhibits a very large surface area. The resulting pores 24 are interspersed within a plurality of "nanocrystallites" 26 extending through the thickness of the porous layer 16. The nominal cross sectional dimension of each region is very small, being on the order of 5–100 nm, and the geometrical configuration of the pores is polyhedral. It is believed that the submicron dimensions of these regions are responsible for the confinement of the energetic carriers in quantum well.

Figure 1D:
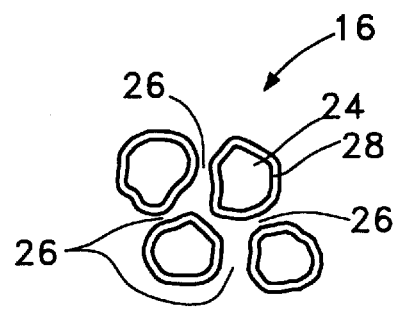
FIG. 1D is enlarged cross-sectional side view of the porous silicon carbide layer of FIG. 1C after passivation.

As earlier stated, the present invention involves the introduction an extremely thin passivating film to the nonplanar surface of the porous semiconductor layer for the purpose of enhancing its radiative or luminescence efficiency. A passivating film, by design, must cover as much of the internal surface area, created by the porosity, as possible without introducing damage to the relatively fragile crystallites. This is accomplished in the present invention by performing a very short, dry thermal oxidation process at an elevated temperature, in order to grow one or more thin monolayers 28 of oxide on the wall of each pore 24 as shown in FIG. 1D. The short thermal oxidation process consists of preparing the as-anodized porous SiC film 16 for the oxidation process with a RCA clean, which is a standard semiconductor cleaning process which uses hydrogen peroxide ($H_2O_2$), sulfuric acid ($H_2SO_4$), deionized water ($H_2O$), ammonium hydroxide ($NH_4OH$), hydroflouric acid (HF) and hydrochloric acid (HCl). It should be noted that any other suitable semiconductor process can be used. Following this, an oxidation furnace is stabilized at a temperature of approximately 1150° C. and atmospheric pressure, and is purged with nitrogen for a period of 15 minutes. The oxidation temperature is chosen to balance the need for a high enough temperature to grow an oxide film on the pore walls of the porous SiC against the need for a relatively slow rate and controllable rate of oxidation.

In any case, the furnace gas is then switched to dry oxygen, flowing at a rate of approximately 1 liter/min. The as-anodized and RCA-cleaned substrate wafer 10 is placed on a quartz boat which is then placed in the furnace, and is oxidized for a period of approximately 5 minutes. The duration of the oxidation process can vary somewhat depending upon the as-anodized porous SiC film's initial porosity and nanostructure and the desired thickness of the oxide.

The oxidation process of the present invention results in the growth of one to three monolayers of oxide on the pore walls, with the exact number depending spatially upon the length of time and the local density of surface atoms. Following the 5 minute thermal oxidation process, the substrate wafer 10 is carefully removed from the furnace and allowed to cool at ambient temperature and pressure.

The thermal oxidation of a planar SiC semiconductor surface its in both a conversion of a fraction of the preexisting semiconductor volume to silicon dioxide and/or silicon monoxide as well as an addition of such oxide(s) to the original volume. In contrast, the short thermal oxidation process of the porous semiconductor region according to the present invention not only passivates the large, unpassivated internal surface area, dramatically reducing the number of surface states, and enhancing the radiative efficiency, but also reduces the diameter of the pores 24 and thins and shrinks the nanocrystallites 26, as shown schematically in FIG. 1D. In the regime of quantum-sized structures, or structures with characteristic size comparable to the Bohr excitonic radius (~150 Angstroms), a further relaxation of the momentum selection rules and distortion of the band structure can occur. This results in a further enhancement of the radiative efficiency. In fact, the observed photoluminescence peak intensity of porous SiC, passivated in accordance with the present invention, is more than ten (10) times more intense as compared to "as-anodized" porous SiC, as well as blue-shifted in its spectral peak. This luminescence represents a peak intensity of a factor of more than 400 times greater than the donor-acceptor-pair (DAP) or free-to acceptor transition luminescence that is normally observed in bulk unpassivated SiC. In addition, the increased transmissivity, decreased reflectivity and sharper absorption edge of the passivated porous SiC film allows it to be utilized in a number of optoelectronic device applications.

In order to further understand the improvements described above, the "quantum efficiency" of porous SiC, passivated in accordance with the present invention, will now be discussed. The "internal quantum efficiency" of a material is a convenient measure and demonstration of the material's potential utility as a light-emitting device, determines the efficiency of light generation in a semiconductor material, and is defined for the purpose of the present invention, as the ratio of the radiative electron-hole recombination rate to the total recombination rate. The quantum efficiency of indirect bandgap semiconductors is quite low, typically less than 0.1%, with the quantum efficiency of the donor-acceptor pair radiative recombination in bulk alpha-SiC (6H—SiC) being approximately 0.01%. The quantum efficiency of passivated porous SiC, deduced from optical measurements, is approximately 5%. With this level of quantum efficiency, porous SiC passivated in accordance with the present invention, is a candidate material for a range of new light emitting and other photonic devices.

Figure 2:
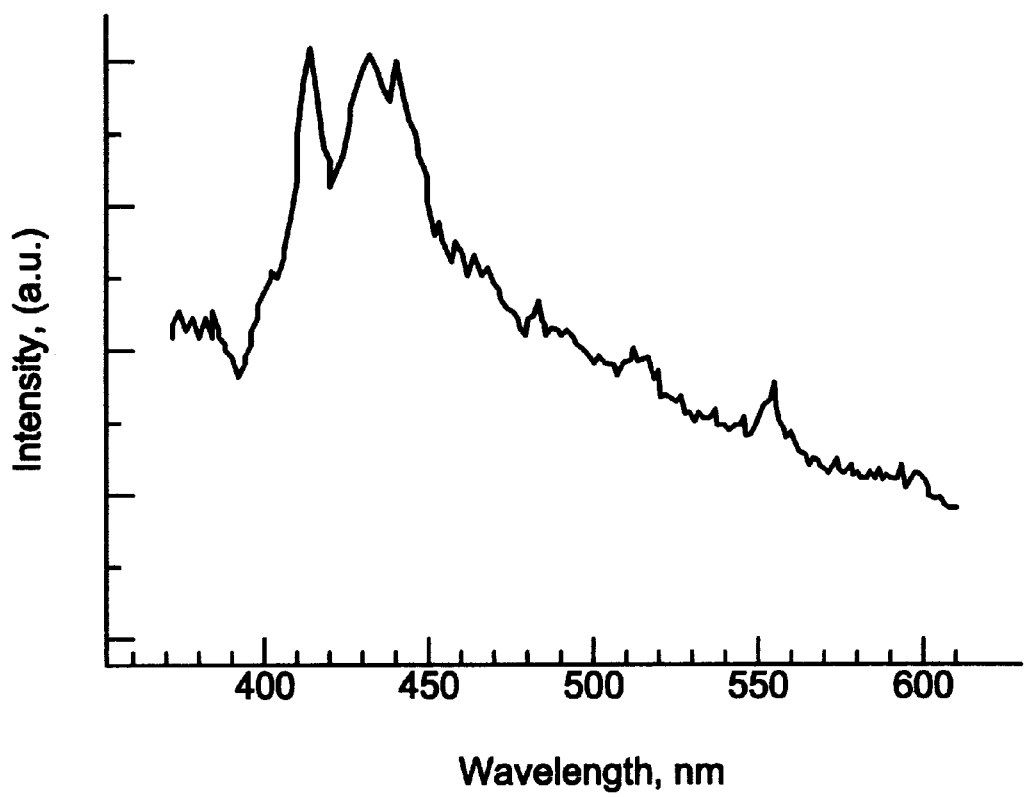
FIG. 2 is a graph depicting luminescence intensity plotted as function of wavelength for silicon carbide passivated according to the present invention.

FIG. 2 is a graph showing luminescence intensity plotted as a function of wavelength for porous SiC passivated according to the present invention. As shown therein, porous SiC passivated in accordance with the present invention, exhibits a peak wavelength of light emission of approximately 410 nm or a deep blue color.

This enhanced photoluminescence result also applies to the case of electroluminescence, thus, the porous SiC films passivated according to the present invention, can be used in more efficient blue light-emitting diode devices than are currently available in SiC. Such devices will be more intense than commercially available bulk SiC LEDs (DAP luminescence), and will not require an epilayer-on-substrate structure, or implanted pn junction, thereby simplifying the fabrication process and cost of such devices. It should noted that unlike Si, the oxidation rate of SiC is negligibly small even at moderately elevated temperatures, accordingly, the porous SiC structure will not oxidize any further. This means that the passivated structure and its optical properties will be beneficially more stable over longer periods of time, and also at higher temperatures when used in a device such a light-emitting diode or the like.

Other benefits arise from passivating porous SiC according to the present invention. As is well known in the art, as-anodized porous SiC is extremely fragile and is thus, difficult to handle and further process without breakage. Once, however, porous SiC is passivated in accordance with the present invention, the material strength of the passivated porous SiC film is substantially enhanced when compared with as-anodized porous SiC, such that further processing and handling can be had without significant events of breakage.

It should be understood, that other techniques which are well-suited for passivating the large internal surface area presented by the porous semiconductor material also include, but are not limited to, chemical-vapor deposition of a thin, visibly-transparent dielectric, such as silicon nitride ($Si_3N_4$), evaporation techniques, plasma-enhanced chemical vapor deposition of an oxide film, anodic oxidation of the pore walls in electrolytic solution, or the use of a spin-on material.

The passivation technique of the present invention can also be implemented with any of the porous polytypes of SiC, either p- or n-type dopant, formed by either dark-current or photo-assisted electrochemical means, and any other porous materials, such as porous GaP.

Figure 3A:
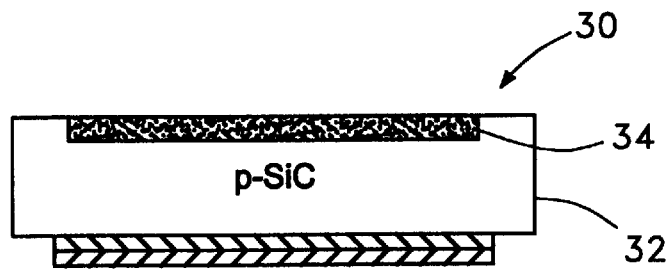
FIGS. 3A–C are cross-sectional side views depicting the fabrication of a heterojunction light-emitting diode device using porous silicon carbide passivated according to the present invention.
Figure 3B:
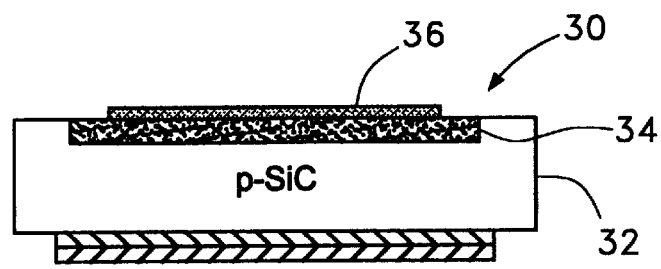
Figure 3C:
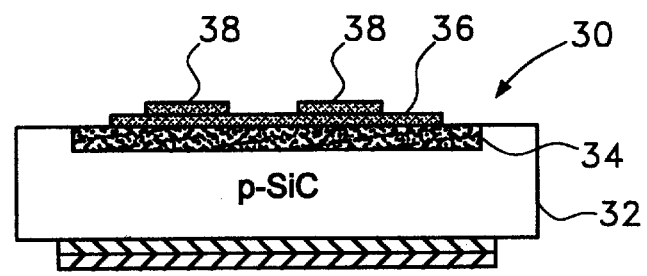

The present invention extends to the fabrication of a heterojunction light-emitting diode devices such as the np heterojunction light emitting diode device 30 shown in FIG. 3C. Referring to FIG. 3A, the diode device 30 comprises a p-type bulk SiC substrate wafer 32 similar to the one shown in FIG. 1B, which includes a porous layer 34 that has been passivated using the very short, dry thermal oxidation technique of the present invention. The passivated porous layer 34 has a thickness on the order of approximately 10 μm. It should be understood, that as many as three monolayers of oxide can be used for passivating the porous SiC layer 34.

The mask used for porous film patterning (not shown) is removed by etching or the like and a layer 36 of transparent n-type semiconductor, such as indium tin oxide (ITO or In$_2$O$_3$) or zinc oxide (ZnO), is sputter deposited or evaporated directly onto the porous SiC film 34 through a shadow mask, leaving the transparent n-type semiconductor material in selected areas, smaller than the porous SiC area, as shown in FIG. 3B.

Figure 3D:
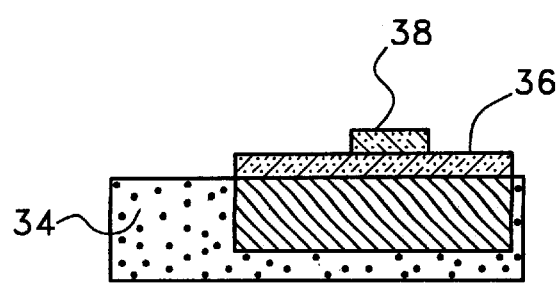
FIG. 3D depicts how the space charge layer extends into the passivated porous silicon carbide layer when the heterojunction of FIG. 3C is placed under a forward bias.

A layer 38 of gold or other suitable metal is then sputter deposited or evaporated through a shadow mask directly onto a small area of the ITO layer 36 for electrical contact. The resulting diode structure is shown in FIG. 3C. The extent to which the doping concentration of the ITO layer 36 is larger than that of the porous SiC region governs the location of the so-called depletion, or space-charge region of the heterojunction. Since this depletion region is the area in which electron-hole pairs recombine radiatively for light-emission, a judicious choice of starting materials and other post processing steps can be made to cause this region, when the heterojunction is placed under forward bias, to extend primarily into the passivated porous SiC layer, as depicted in FIG. 3D by triangles. Accordingly, a further advantage of the passivated SiC film's enhanced radiative efficiency and short wavelength emission characteristics, is realized.

It should be understood, that the scope of the present invention is intended to encompass any combination of p and or n-type passivated or as-anodized layers in combination with any number of transparent semiconductor material layers which need not be ITO and can be ZnO or any other transparent semiconductor material. Moreover, for the purpose of improving the radiative efficiency of a porous material, the present invention extends to the use of any appropriate passivating material which is capable of substantially eliminating dangling bonds and the surface states which prevent efficient radiative recombination. Such passivating materials include, but are not limited to Si$_3$N$_4$, SiH, and SiO$_x$. Further, the method used for depositing the passivation film may include chemical vapor deposition, plasma-enhanced deposition, or any other method which achieves good surface coverage of the large internal surface area.

It should be understood that the embodiments described herein are merely exemplary and that a person skilled in the art may make many variations and modifications to the disclosed embodiments utilizing functionally equivalent elements to those described herein. Any and all such variations or modifications as well as others which may become apparent to those skilled in the art, are intended to be included within the scope of the invention as defined by the appended claims.

What is claimed is:

1. A heterojunction light-emitting diode device, comprising:
    a bulk semiconductor wafer of a first conductivity having a porous semiconductor layer on an exposed surface of said substrate wafer, said porous semiconductor layer comprised of a plurality of pores within a plurality of nanocrystallites, wherein each of said pores is defined by a pore wall and each of said nanocrystallites has a given thickness;
    at least one monolayer layer of passivating material on said pore wall of each of said pores, to passivate said porous semiconductor layer, wherein said passivated porous semiconductor layer exhibits a quantum efficiency of approximately 5 percent;
    a transparent layer of semiconductor material disposed on selected areas of said passivated porous semiconductor layer, said transparent layer having a second conductivity, opposite to said first conductivity; and
    an electrical contact layer disposed on a selected area of said transparent layer.

2. The diode device according to claim 1, wherein said transparent layer of semiconductor material comprises indium tin oxide.

3. The diode device according to claim 1, where said at least one monolayer of passivating material comprises an oxide.

4. A heterojunction light-emitting diode device, comprising:
    a bulk semiconductor wafer of a first conductivity having a porous semiconductor layer on an exposed surface of said substrate wafer, said porous semiconductor layer comprised of a plurality of pores within a plurality of nanocrystallites, wherein each of said pores is defined by a pore wall and each of said nanocrystallites has a given thickness;
    at least one monolayer of passivating material approximately 1 nm thick on said pore wall of each of said pores, to passivate said porous semiconductor layer, wherein said passivated porous semiconductor layer exhibits a quantum efficiency of approximately 5 percent;
    a transparent layer of semiconductor material disposed on selected areas of said passivated porous semiconductor layer, said transparent layer having a second conductivity, opposite to said first conductivity; and
    an electrical contact layer disposed on a selected area of said transparent layer.

5. A heterojunction light-emitting diode device, comprising:
    a bulk semiconductor wafer comprising bulk silicon carbide of a first conductivity having a porous semiconductor layer comprising porous silicon carbide on an exposed surface of said substrate wafer, said porous semiconductor layer comprised of a plurality of pores within a plurality of nanocrystallites, wherein each of said pores is defined by a pore wall and each of said nanocrystallites has a given thickness;
    at least one monolayer of passivating material on said pore wall of each of said pores, to passivate said porous semiconductor layer, wherein said passivated porous semiconductor layer exhibits a quantum efficiency of approximately 5 percent;
    a transparent layer of semiconductor material disposed on selected areas of said passivated porous semiconductor layer, said transparent layer having a second conductivity, opposite to said first conductivity; and
    an electrical contact layer disposed on a selected area of said transparent layer.

6. The diode device according to claim 4, wherein said transparent layer of semiconductor material comprises indium tin oxide.

7. The diode device according to claim 4, where said at least one monolayer of passivating material comprises an oxide.

8. The diode device according to claim 5, wherein said transparent layer of semiconductor material comprises indium tin oxide.

9. The diode device according to claim 5, where said at least one monolayer of passivating material comprises an oxide.

* * * * *